United States Patent
Mayer et al.

(10) Patent No.: US 10,804,908 B2
(45) Date of Patent: Oct. 13, 2020

(54) CLOCK GENERATOR, PHASE LOCKED LOOP, APPARATUS, METHOD AND COMPUTER PROGRAM FOR GENERATING A CLOCK SIGNAL, TRANSCEIVER, AND MOBILE TERMINAL

(71) Applicant: Intel IP Corporation, Santa Clara, CA (US)

(72) Inventors: Thomas Mayer, Linz (AT); Christian Wicpalek, Puchenau (AT)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 16/348,184

(22) PCT Filed: Nov. 7, 2017

(86) PCT No.: PCT/US2017/060263
§ 371 (c)(1),
(2) Date: May 8, 2019

(87) PCT Pub. No.: WO2018/111440
PCT Pub. Date: Jun. 21, 2018

(65) Prior Publication Data
US 2019/0268004 A1    Aug. 29, 2019

(30) Foreign Application Priority Data
Dec. 16, 2016 (EP) .................................. 16204606

(51) Int. Cl.
*G05F 1/04* (2006.01)
*H03K 3/00* (2006.01)
(Continued)

(52) U.S. Cl.
CPC .......... *H03L 7/0802* (2013.01); *G04F 10/005* (2013.01); *G06F 1/04* (2013.01);
(Continued)

(58) Field of Classification Search
CPC ......... H03L 7/0891; H03L 7/18; H03L 7/093; H03L 7/087; H03L 7/10; G06F 1/10; G06F 1/04; G06F 1/08; H03K 5/135; G11C 7/22
(Continued)

(56) References Cited

U.S. PATENT DOCUMENTS 8,248,127 B2 *  8/2012  Chan ...................... H03L 7/093
                                                         327/156
8,855,258 B1   10/2014  Do et al.
(Continued)

FOREIGN PATENT DOCUMENTS

EP    2575260 A1    4/2013
WO    2016109407 A1    7/2016

*Primary Examiner* — Anh Q Tra
(74) *Attorney, Agent, or Firm* — 2SPL Patent Attorneys PartG mbB; Kieran O'Leary

(57) ABSTRACT

Examples provide a system, a phase locked loop, an apparatus, a method and a computer program for generating a clock signal, a transceiver, and a mobile terminal. A system comprises clock generator (10) configured to output provide a clock signal having a predefined average clock rate, a reference signal generator (14) configured to provide a reference signal, and a clock divider (16) configured to divide the reference signal to generate the clock signal, wherein a time difference between a clock cycles and a subsequent clock cycle of the clock signal is irregular.

20 Claims, 10 Drawing Sheets

(51) Int. Cl.

| | |
|---|---|
| *H03L 7/08* | (2006.01) |
| *G04F 10/00* | (2006.01) |
| *G06F 1/08* | (2006.01) |
| *G06F 1/10* | (2006.01) |
| *G06F 7/58* | (2006.01) |
| *H03K 3/84* | (2006.01) |
| *H03L 7/091* | (2006.01) |
| *H03L 7/099* | (2006.01) |
| *G06F 1/04* | (2006.01) |
| *H03L 7/085* | (2006.01) |
| *H03L 7/197* | (2006.01) |

(52) U.S. Cl.
CPC ............... *G06F 1/08* (2013.01); *G06F 1/10* (2013.01); *G06F 7/588* (2013.01); *H03K 3/84* (2013.01); *H03L 7/085* (2013.01); *H03L 7/091* (2013.01); *H03L 7/0992* (2013.01); *H03L 7/197* (2013.01)

(58) Field of Classification Search
USPC .......................................... 327/156, 291–298
See application file for complete search history.

(56) References Cited

U.S. PATENT DOCUMENTS

| | | | |
|---|---|---|---|
| 2002/0136264 A1* | 9/2002 | Herleikson | A61B 5/0535 375/130 |
| 2005/0151678 A1* | 7/2005 | Bilinskis | H03M 1/128 341/123 |
| 2007/0296510 A1* | 12/2007 | Backes | H03L 7/18 331/16 |
| 2011/0064150 A1 | 3/2011 | Uozumi et al. | |
| 2013/0113528 A1 | 5/2013 | Frantzeskakis et al. | |
| 2014/0197875 A1 | 7/2014 | Potty et al. | |
| 2016/0182262 A1 | 6/2016 | Leistner et al. | |
| 2017/0134030 A1* | 5/2017 | Mofidi | H03L 7/104 |

* cited by examiner

CLOCK GENERATOR, PHASE LOCKED LOOP, APPARATUS, METHOD AND COMPUTER PROGRAM FOR GENERATING A CLOCK SIGNAL, TRANSCEIVER, AND MOBILE TERMINAL

FIELD

Examples relate to a clock generator, a phase locked loop, an apparatus, a method and a computer program for generating a clock signal, a transceiver, and a mobile terminal, and in particular, but not exclusively, to generating a clock signal, for example, for a Phase Locked Loop (PLL), with improved spur properties.

BACKGROUND

In general, clock signals can be seen as repetitions of mostly rectangular pulses with a certain fundamental frequency. Spectra of such pulses show harmonics at integer multiples of the fundamental frequency, i.e. narrowband spectral components (spurs) with different amplitudes. A reference clock of a PLL can create unwanted spurs in the Local Oscillator (LO) signal of a Radio Frequency (RF) transceiver due to crosstalk effects. This may owe to the fact that a strong switching activity at reference clock rate may have a lot of harmonic content. Therefore harmonics of the reference clock falling into a band of interest may create unwanted spurs. This may be especially be true if a low reference clock frequency is chosen because the harmonics of this clock signal create a dense grid of these spurs, making it difficult to find a clock frequency, for which no harmonics fall into a band of interest. In contrast, a low reference clock frequency may sometimes be desired, especially for PLLs with low power consumption. Therefore, a compromise between the two effects may be found.

BRIEF DESCRIPTION OF THE FIGURES

Some examples of apparatuses, methods and/or computer programs will be described in the following by way of example only, and with reference to the accompanying figures, in which.

DETAILED DESCRIPTION

Figure 1:
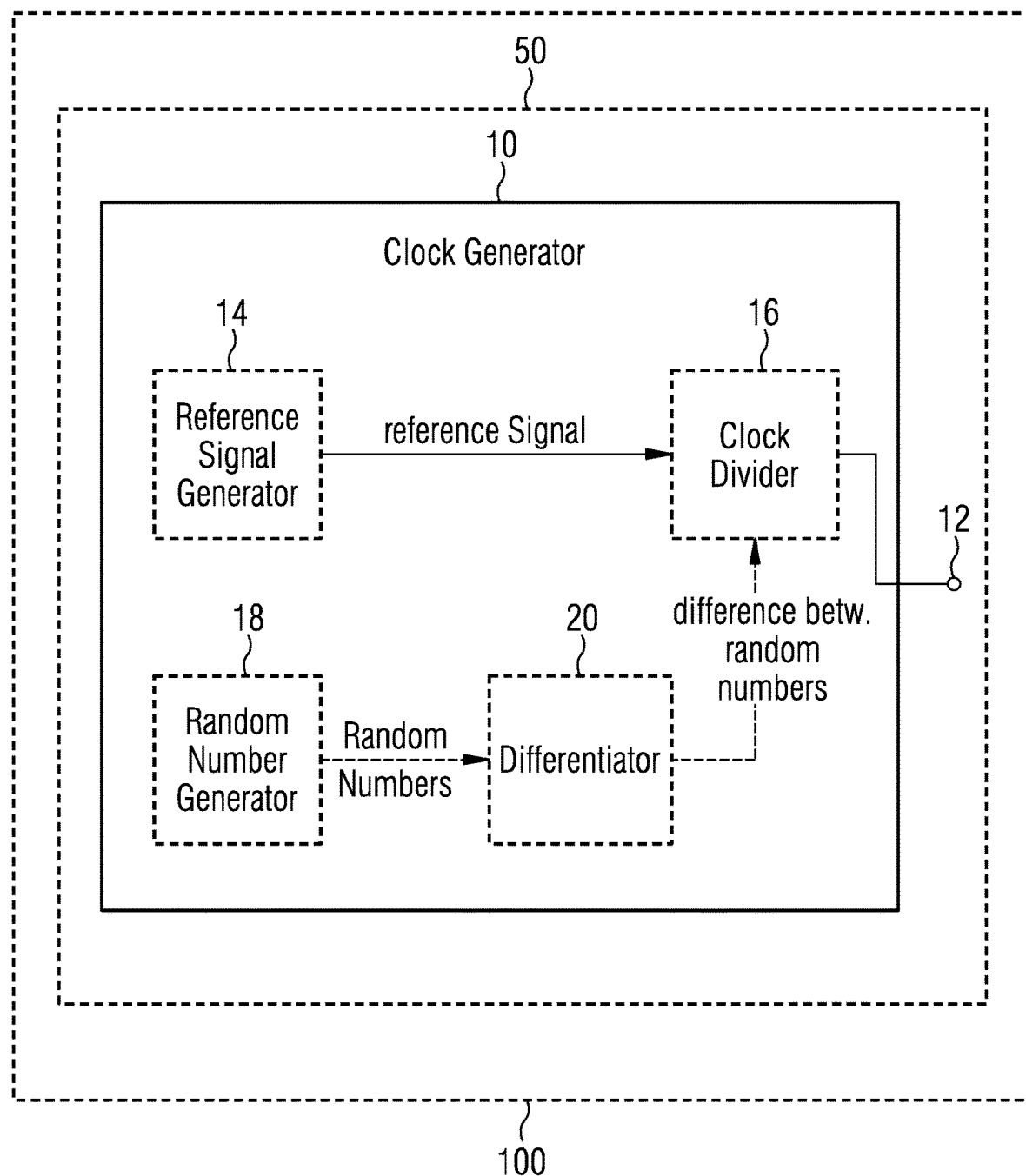
FIG. 1 shows an example of a clock generator.

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than 2 Elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Examples are based on the finding that a PLL clocked at a low rate without raising the problem of densification of harmonic content would be beneficial. Examples are therefore based on a clock generator, which generates an irregular clock signal with a predefined average clock rate and improved spectral properties, in particular but not exclusively for PLL application. An example of such a generator may be used in an example PLL. The irregularity in the clock signal forms its spectral properties. Dense harmonic signals may be reduced, in some examples even avoided.

Examples may be based on a generation of an irregular clock with widely spaced harmonics. The spacing of the harmonics may be controlled by the degree of irregularity introduced to the clock signal. An irregular clock signal can be generated from a higher rate clock signal using a clock divider, where the divider ratio may be changed by a sequence with specific properties to achieve the irregularity. In some examples the divider ratio may be changed each divided clock cycle. Examples of the clock generator with the irregular clock signal may be applied to a PLL. Because the clock edges are placed irregularly, the time difference between two consecutive reference clock edges is also irregular.

In some examples this is considered in an instantaneous divider value used in a PLL such that a divider output signal follows the reference clock edge shifts in the same way. Then a phase detector, e.g. a Time-to-Digital Converter (TDC), might not experience clock shifts and the PLL may operate similar to a PLL with a regular clock. By clocking certain components in a PLL with the irregular clock signal an influence of the irregularity on the PLL control loop can be kept at a low level or even be avoided. Examples may provide multiple options for PLL circuit implementations with irregular clock signals. Examples may provide improved spectral properties (power density or power distribution of harmonics) of the clock signal as compared to dithering. Moreover, at least some examples may provide improved efficiency or lower power consumption of the clock generator, a PLL, or a transceiver comprising the clock generator or the PLL.

Staying at the high clock rate in order to avoid the dense harmonic grid may result in a penalty in power consumption. Active cancellation of spurs in the RX and TX signal may be an option to reduce the spurs, but such implementation may require complicated algorithms. It could be computationally intensive to detect and cancel the phase and amplitude of the spurs. Examples may create a clock signal, which has on average a wanted or predefined low clock rate but a wide distance between harmonics. Examples are based on the finding that a strong harmonic is created when an event is repeated very regularly. Therefore, examples may attempt to randomize the location of the events of clock edges to a certain extent.

An implementation of such a randomization structure in an example is shown in FIG. 1, in which optional components are indicated by broken lines. FIG. 1 shows an example of a system with a clock generator 10. The clock generator 10 comprises an output 12 and is configured to provide or generate a clock signal. The output 12 may be any analog or digital interface, pin or connector that allows for clock signal provision. As will be detailed in the sequel, examples also provide a PLL 50 comprising an example of a system or clock generator 10. Examples may also provide a transceiver 100 comprising an example of the PLL 50. Examples of a PLL 50 and a transceiver 100 are indicated by dashed lines in FIG. 1. The system further comprises a reference signal generator 14 to provide a reference signal, and a clock divider 16 configured to divide the reference signal to generate the clock signal. A time difference between a clock cycle and a subsequent clock cycle of the clock signal is irregular.

The clock signal has a predefined average clock rate. A time difference between subsequent, precedent or adjacent clock cycles is irregular. In other words, a time difference between two clock cycles following each other varies to a certain extent. As will be detailed in the sequel, such variation can be controlled and therewith a spectral distribution and a power density of harmonics of the clock signal. The clock generator 10 or system may be implemented using analog or digital components, e.g. oscillators, logical components, programmable components, etc. Another example is a system comprising an apparatus 10 for generating or for providing a clock signal. In the following multiple components will be described, which may be implemented together, e.g. on the same substrate, chip, processor or Printed Circuit Board (PCB), or separately from each other, e.g. on different substrates, processors, chips or PCBs.

There are multiple options on how to implement the components as described here and in the following. Examples may use analog or digital components, a combination thereof, respectively. One way of implementing (logic) components is by the use of transistors, e.g. in terms of Resistor-Transistor Logic (RTL). Other examples may use Transistor-Transistor Logic (TTL), Diode-Transistor Logic, Field-Effect-Transistors (FET), etc. Complementary Metal-Oxide FET-technology (CMOS) may be used. Other typical components may be programmable hardware, a processor, a Digital-Signal-Processor (DSP), etc.

For example, the clock generator 10 or system may comprise a reference signal generator 14 or an input, any means for providing, configured to provide a reference signal, which can be regular. It is to be understood that the term "regular" is to be interpreted as "basically regular" rather than "perfectly regular". As known in the art, when implementing clock generators or oscillators in general, they may have certain imperfections due to non-perfect components, aging of components, manufacturing tolerances, implementation specifics etc. Therefore, the term "regular" is to be interpreted as regular with certain tolerances. The level of regularity, however, is high enough to serve the purpose or implementation, e.g. to provide a PLL for a radio transceiver with a clock signal.

The reference signal generator 14 or system may correspond to any means for generating or providing a clock signal, e.g. one or more generator modules, units or devices, which may also comprise analog or digital components, such as one or more oscillators, logical or programmable components, a quartz or crystal, etc. In some examples such a reference signal generator may be external to the clock generator 10, which may comprise an input, a pin, an interface, a connector, etc. to be provided with the reference signal. As further indicated by FIG. 1 the clock generator 10 or system may further comprise a clock divider 16 configured to divide the reference signal to obtain the clock signal. The clock divider 16 may correspond to any means for dividing, one or more divider units, modules or devices and it may be implemented using analog and/or digital components, such as logical components or programmable components. A clock frequency of the reference signal may be an integer multiple of the predefined average clock rate. In the example depicted in FIG. 1 the reference signal generator 14 is coupled to the clock divider 16. An example of the divider 16 may be a multi-modulus-divider 16, means for multi-modulus dividing, respectively, configured to set a time difference between at least two clock cycles in the clock signal based on a number of cycles in the reference signal. The number of cycles in the reference signal between the at least two clock cycles in the clock signal may correspond to the difference between at least two subsequently generated random numbers.

As shown in FIG. 1 in an example, the clock divider 16 (means for dividing) may be configured to divide the reference signal based on a varying divider ratio. An average varying divider ratio may relate the reference signal to the predefined average clock rate. The average varying divider ratio may define a ratio between the reference signal and the predefined average clock rate.

For example, a random number generator 18 or pseudo random generator (means for generating random or pseudo random numbers) may be configured to generate random numbers at a predefined statistical distribution. The random number generator 18 or pseudo random generator may correspond to any means for generating (pseudo) random numbers, e.g. one or more generator units, devices or modules. It may be implemented using analog and/or digital components, such as logical components or programmable components. The predefined distribution may be a uniform distribution, in other examples it may be a Gaussian (normal) or other distribution, e.g. Poisson, Bernoulli, binomial, etc. It is to be noted that such distribution may determine a characteristic of the irregularity to be introduced to the clock signal and may therefore determine spectral properties of the clock signal (e.g. density, frequency and intensity of the harmonics). The random number generator 18, the means for generating random numbers, respectively, may be configured to generate uniformly distributed random integer numbers between 0 and an N−1. N corresponds to a positive integer value in the present example and may also serve as parameter for influencing the spectral properties of the irregular clock signal as will be shown in the sequel.

In further examples the clock generator 10 may comprise a differentiator 20 or means for differentiating configured to determine a difference between at least two subsequently generated random numbers. The differentiator 20 may correspond to one or more differentiator units, devices or modules. It may be implemented using analog and/or digital components, such as logical components or programmable components. As shown in FIG. 1 in an example, the random number generator 18 is coupled to the differentiator 20. The random numbers are input into the differentiator 20 in FIG. 1. The differences between subsequently generated random numbers then determine the divider value for the divider 16.

Figure 12:
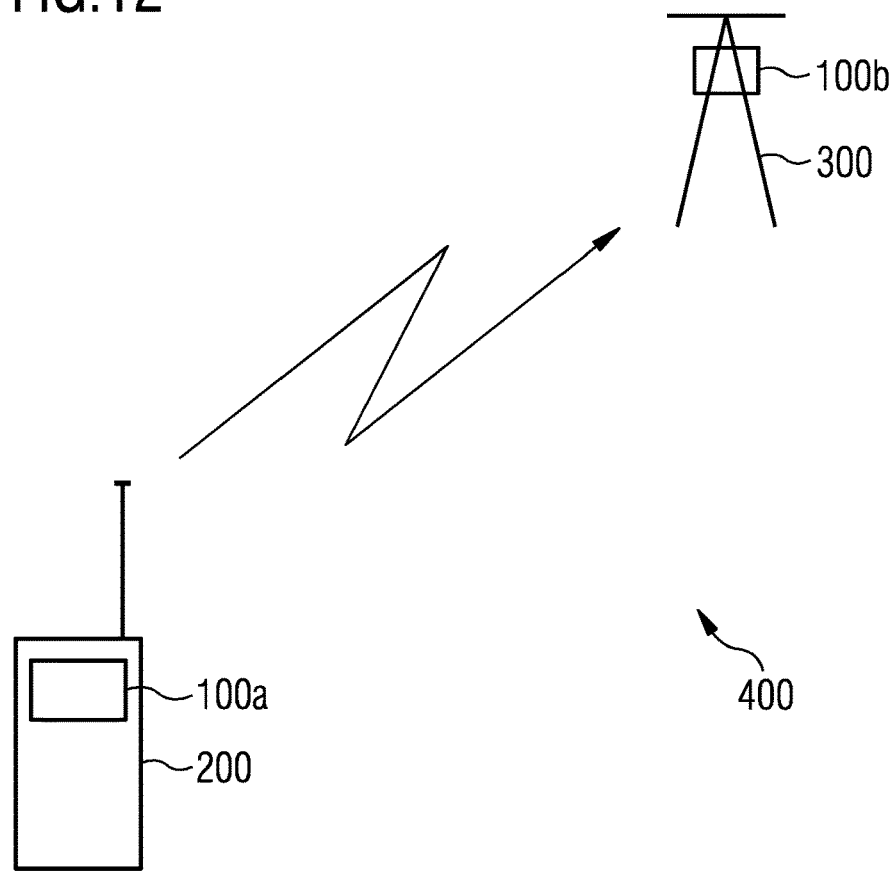
FIG. 12 shows a network scenario of an example.

FIG. 12 shows a network scenario of an example. The network scenario comprises a mobile terminal 200 and base station transceiver 300 in a mobile communication system 400. According to another example, a mobile terminal 200 is provided comprising an example a radio transceiver 100*a* according to the present description. Another example is a base station transceiver comprising an example 100*b* of the radio transceiver according to the present description. Yet another example is a mobile communication system 400 comprising at least one of an example of a mobile terminal 200 and an example of a base station transceiver 300.

The mobile communication system 400 may correspond, for example, to a communication network such as one of the Third Generation Partnership Project (3GPP)-standardized mobile communication networks, where the term mobile communication system is used synonymously to mobile communication network. The mobile or wireless communication system may correspond to a mobile communication system of the 5th Generation (5G) and may use mm-Wave technology. The mobile communication system may correspond to or comprise, for example, a Long-Term Evolution (LTE), an LTE-Advanced (LTE-A), High Speed Packet Access (HSPA), a Universal Mobile Telecommunication System (UMTS) or a UMTS Terrestrial Radio Access Network (UTRAN), an evolved-UTRAN (e-UTRAN), a Global System for Mobile communication (GSM) or Enhanced Data rates for GSM Evolution (EDGE) network, a GSM/EDGE Radio Access Network (GERAN), or mobile communication networks with different standards, for example, a Worldwide Inter-operability for Microwave Access (WI-MAX) network IEEE 802.16 or Wireless Local Area Network (WLAN) IEEE 802.11, generally an Orthogonal Frequency Division Multiple Access (OFDMA) network, a Time Division Multiple Access (TDMA) network, a Code Division Multiple Access (CDMA) network, a Wideband-CDMA (WCDMA) network, a Frequency Division Multiple Access (FDMA) network, a Spatial Division Multiple Access (SDMA) network, etc.

A base station or base station transceiver 300 may be operable or configured to communicate with one or more active mobile transceivers 200. A base station transceiver 300 can be located in or adjacent to a coverage area of another base station transceiver, e.g. a macro cell base station transceiver or small cell base station transceiver. Hence, examples may provide a mobile communication system 400 comprising one or more mobile transceivers 200 and one or more base station transceivers 300, wherein the base station transceivers 300 may establish macro cells or small cells, as e.g. pico-, metro-, or femto cells. A mobile transceiver or terminal may correspond to a smartphone, a cell phone, User Equipment (UE), a laptop, a notebook, a personal computer, a Personal Digital Assistant (PDA), a Universal Serial Bus (USB)-stick, a car, etc. A mobile transceiver may also be referred to as UE or mobile in line with the 3GPP terminology.

A base station transceiver 300 can be located in the fixed or stationary part of the network or system 400. A base station transceiver 300 may correspond to a remote radio head, a transmission point, an access point, a macro cell, a small cell, a micro cell, a femto cell, a metro cell etc. A base station transceiver 300 can be a wireless interface of a wired network, which enables transmission of radio signals to a UE or mobile transceiver. Such a radio signal may comply with radio signals as, for example, standardized by 3GPP or, generally, in line with one or more of the above listed systems. Thus, a base station transceiver may correspond to a NodeB, an eNodeB, a Base Transceiver Station (BTS), an access point, a remote radio head, a transmission point etc., which may be further subdivided in a remote unit and a central unit.

Figure 2:
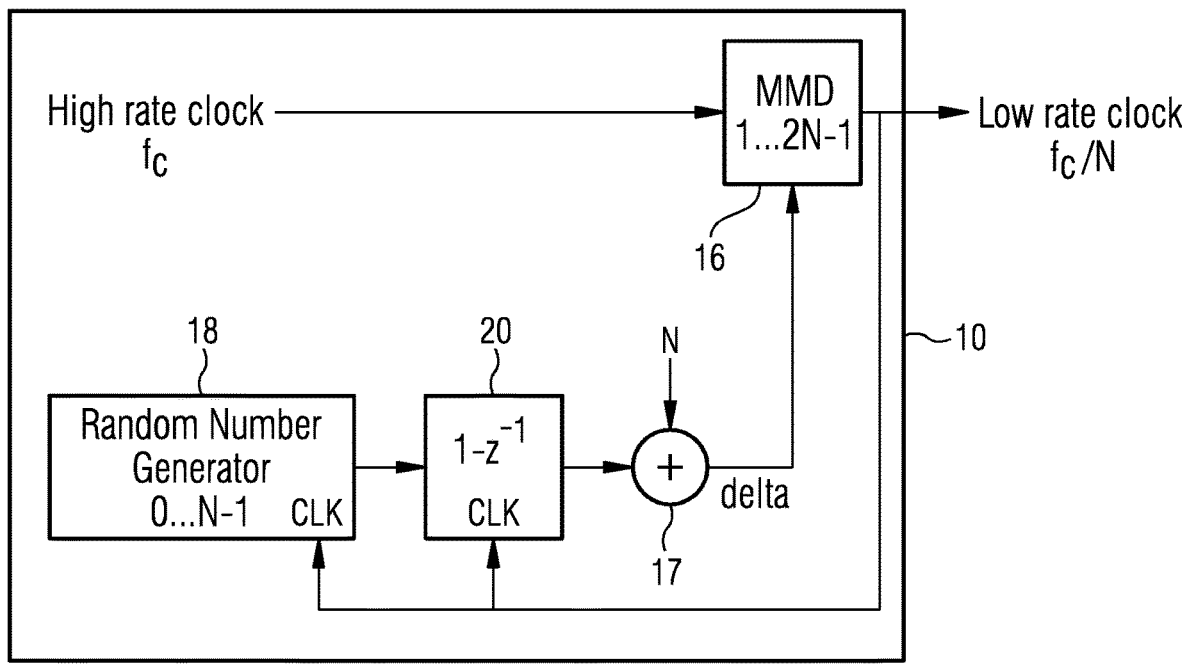
FIG. 2 illustrates another example of a clock generator configured to generate an irregular clock signal at a predefined average clock rate.

FIG. 2 illustrates another example of an irregular clock generator 10. The purpose of the example structure shown in FIG. 2 is to derive a low rate clock (e.g. with clock cycle fc/N, N is a positive integer) of a high rate clock (e.g. with clock cycle fc) input into a MultiModulus-Divider (MMD) 16. In an example, the average ratio between high rate clock and low rate clock may be exactly N, but the clock edge locations of the low rate clock are irregular. The MMD 16 in the example has a input divider value range of 1 . . . 2N−1. In an example, the function is as follows:

A random number generator 18 produces uniformly distributed integer numbers in the range of 0 to N−1. A differentiator 20, which is coupled to the random number generator 18, calculates the difference of two consecutive random numbers. A summation unit 17 adds +N to the difference and outputs a delta signal, which is the time difference between two consecutive low rate clocks (clock edges) using units of high rate clock cycles. The MMD 16 uses the delta signal to generate the low rate clock at rate fc/N out of the high rate clock at rate fc. As can be seen in FIG. 2 the random number generator 18 and the differentiator 20 operate on a clock (CLK) basis and the clock inputs are coupled to the low rate clock output of the MMD 16, such that new random numbers and differences are generated based on the irregular low rate clock.

Figure 3:
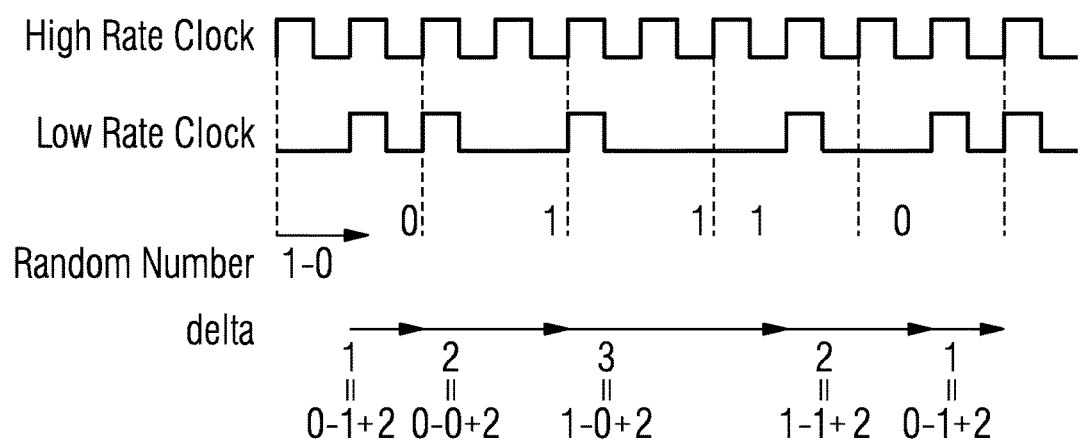
FIG. 3 shows signal waveforms in an example.

FIG. 3 shows signal waveforms in an example. The input and output signals of the structure for N=2 are shown in FIG. 3 with the high rate clock at the top, the low rate clock in the center and the sequences of random numbers and deltas (delta signal values) at the bottom. The random number generator in this example generates a sequence of 1, 0, 0, 1, 1, 0. The delta signal results in the sequence of 1, 2, 3, 2, 1 (difference between the random numbers plus N). As can be seen from the low rate clock signal the time between two subsequent clock cycles corresponds to the delta values in terms of cycles of the high rate clock signal. The dashed lines indicate a pattern of two clock cycle intervals of the high rate clock, each comprising one cycle of the low rate clock rate. From the intervals separated by the dashed lines it can be seen that the average low clock rate is half of that of the high rate clock rate (one cycle in every two-cycle interval of the high rate clock).

Figure 4:
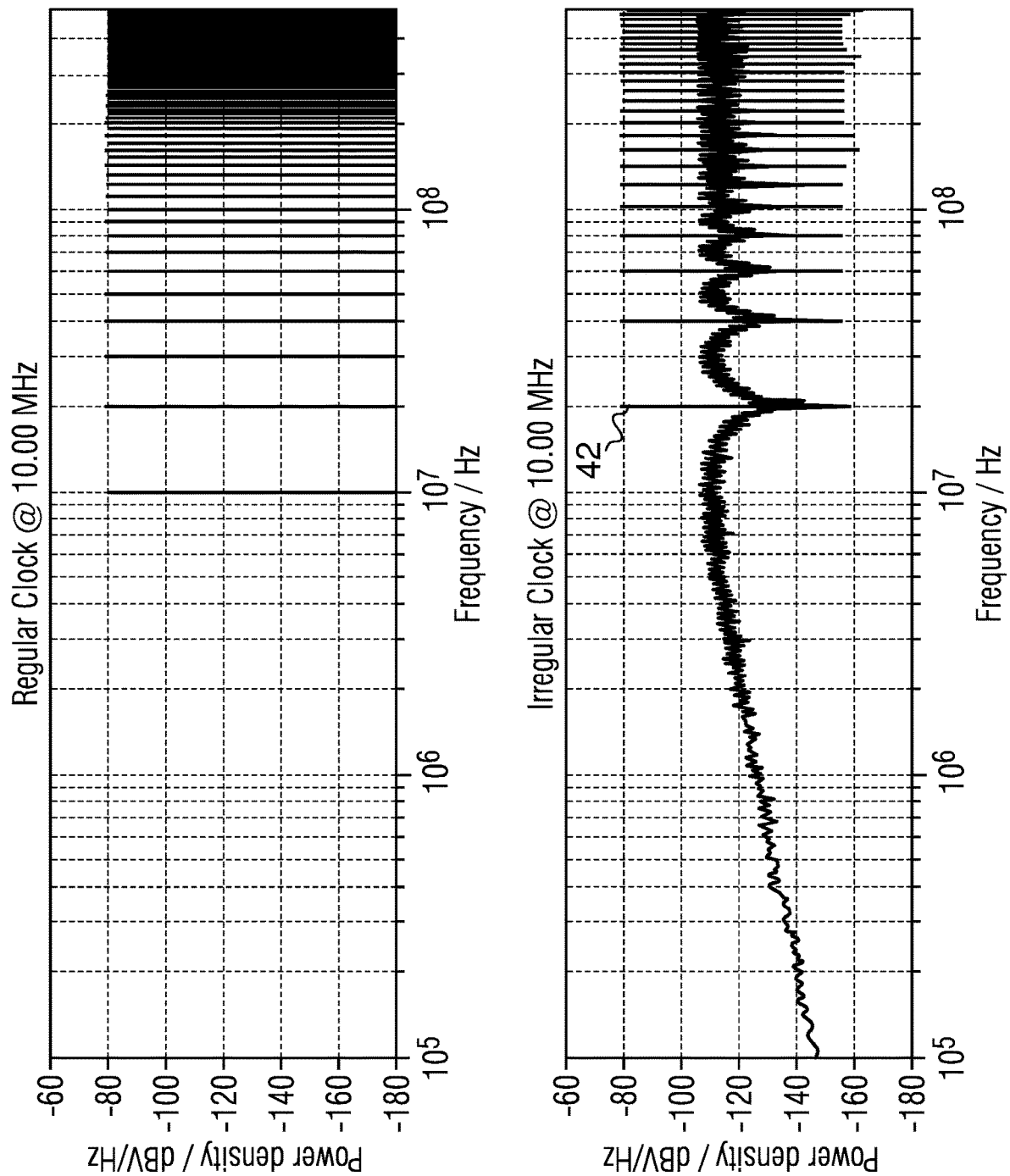
FIG. 4 illustrates clock switching spectra in a comparison between a regular clock (top) and a clock signal of an example (bottom)
Figure 5:
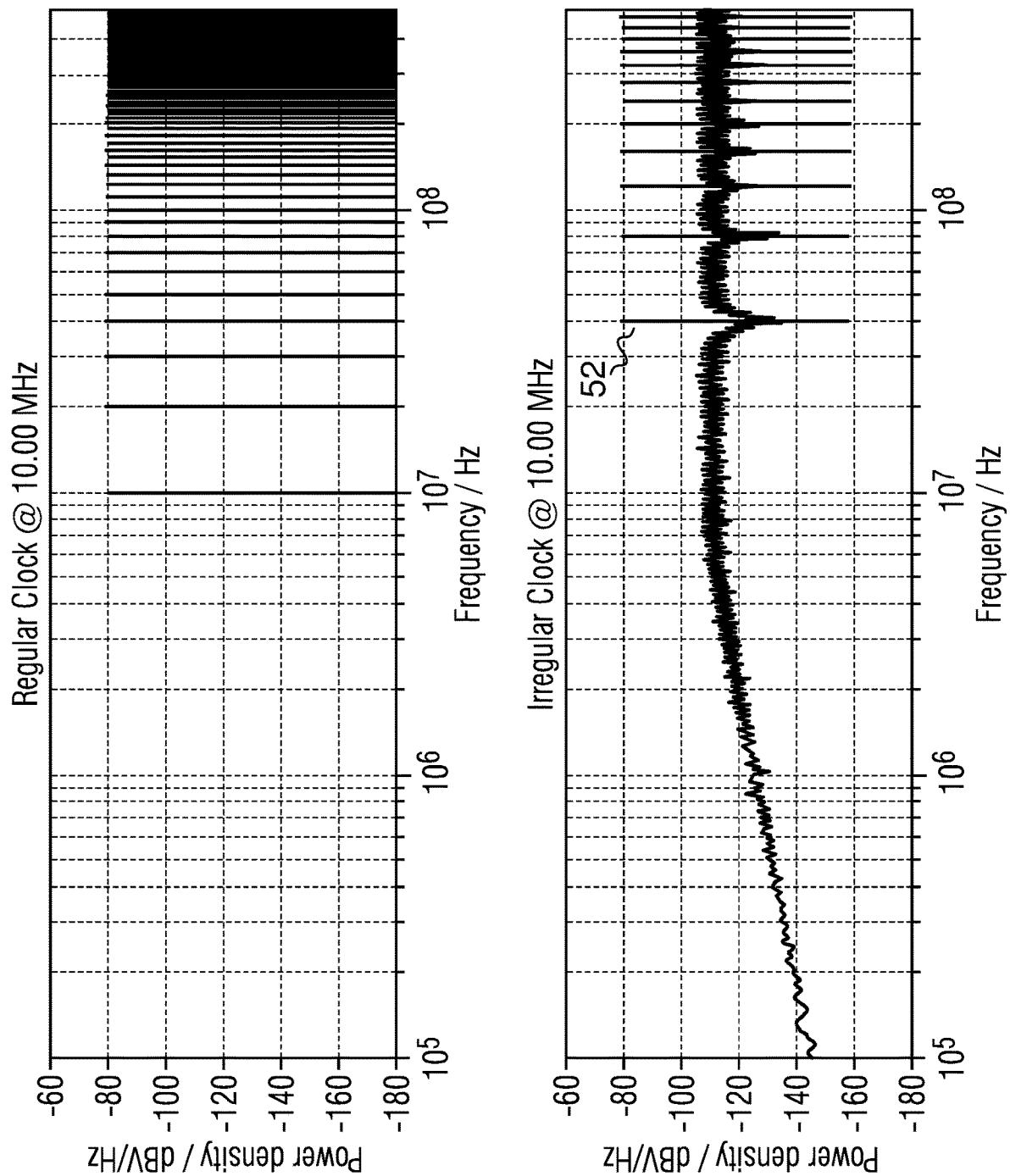
FIG. 5 illustrates clock switching spectra in a comparison between a regular clock (top) and a clock signal of another example (bottom)

In FIG. 3 it can be seen that the clock pulses of the low rate clock are shifted randomly, creating a clock with irregularly spaced rising edges. The duty cycle of this clock is no longer 50%, but for digital systems and according implementations this does not raise any issues. The effect of the switching events of such a clock can be evaluated by looking at the spectrum of a pulse train, in which each pulse is created from a rising clock edge. FIGS. 4 and 5 show spectra of such pulse trains for N=2 and N=4. The wanted low rate clock rate, i.e. the predefined average clock rate, is in both cases 10 MHz.

FIG. 4 illustrates clock switching spectra in a comparison between a regular clock and an irregular clock signal according to an example using N=2. The spectrum of the regular clock signal at 10 MHz is shown at the top (power density /dBV/Hz versus a logarithmic frequency axis in Hz), the spectrum of the irregular clock signal as generated by the example is shown at the bottom. It can be seen that the spur at 10 MHz (10^7 Hz) has been reduced (almost eliminated) and the spectral distance between the spurs has been increased, the spectral density of the spurs has been reduced, respectively. The first significant spur 42 in the spectrum of the example now occurs at 20 MHz (co-aligning with the second harmonic of the regular clock spectrum shown at the top at 2×10$^7$ MHz=20 MHz). A sort of noise floor or spectrally almost white component has been introduced at a power density of about 30 dB below the spur in the spectrum of the irregular clock signal.

FIG. 5 illustrates clock switching spectra in a comparison between a regular clock and an irregular clock signal according to another example with N=4. Again the spectrum of the regular clock at 10 MHz is depicted at the top (power density/dBV/Hz versus a logarithmic frequency axis in Hz) and the spectrum of the irregular clock signal according to the example is depicted at the bottom. The same effects as in FIG. 4 can be observed. The first spur 52 in the spectrum of the example now occurs at 40 MHz (co-aligning with the fourth harmonic of the regular clock spectrum shown at the top at 4×10$^7$ MHz=40 MHz). The density of the spurs can be further reduced (spurs have an even wider spacing) compared to the example spectrum with N=2 (FIG. 4).

FIGS. 4 and 5 illustrate that the harmonics of the regular clock are spaced with the low rate clock frequency of 10 MHz, whereas the irregular clock signal has harmonics spaced with the high rate clock frequency of 20 MHz (N=2) and 40 MHz (N=4), respectively. The parameter N determines some sort of spreading factor for the spurs in spectrum. The higher the irregularity the wider the spurs are separated and the higher the frequency of the first spur in the present example using a uniform distribution.

Figure 6:
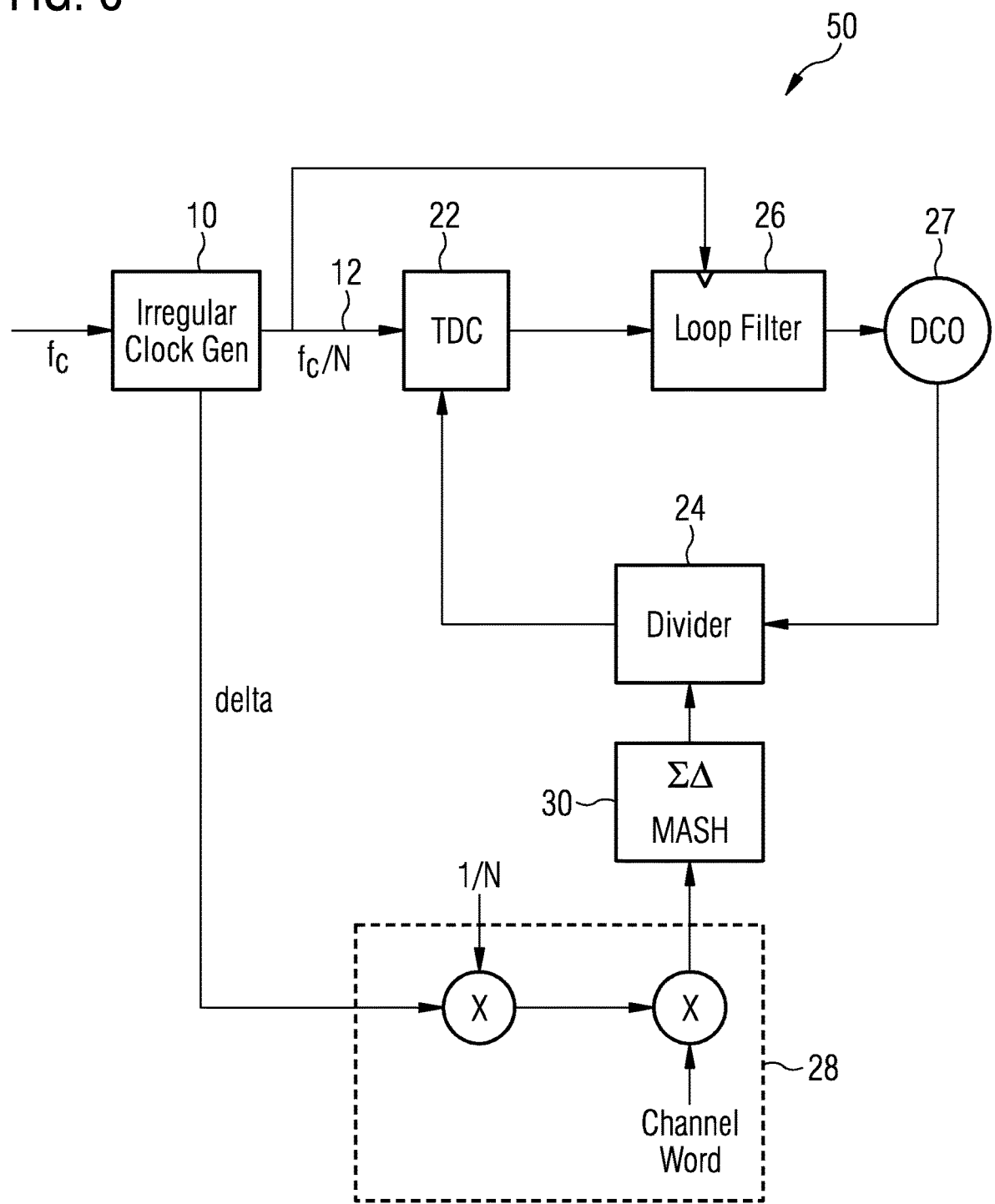
FIG. 6 depicts a block diagram of an example PLL with an irregular reference clock.

Another example is depicted in FIG. 6. FIG. 6 depicts a block diagram of an example of a PLL 50 with an irregular reference clock 10. Examples may also provide a PLL 50 comprising an example of the clock generator 10 or system according to the above description. As shown in FIG. 6, the PLL 50 comprises the irregular clock generator 10 for generating an irregular low rate clock signal at average rate fc/N based on a reference high rate clock signal with rate fc. The PLL comprises a Time-to-Digital Converter 22 (TDC), means for time-to-digitally converting, respectively, with an input that is coupled to the output 12 of the clock generator 10, the irregular low rate clock signal, respectively. The TDC 22 may correspond to any device, unit or module suitable for time digitizing.

The output of the TDC 22 is then input into a loop filter 26, which is coupled to a Digitally Controlled Oscillator 27 (DCO). The loop filter 26 may determine the loop dynamics and may, at least in some examples, be implemented as a low pass filter, e.g. integrator characteristics for stationary stability. Other filter types (proportional, differential, high pass, etc.) or combinations thereof may as well be used to influence the loop dynamics, e.g. stability, gain (attenuation), etc. The loop filter 26 may correspond to a Finite Impulse Response (FIR) filter, an Infinite Impulse Response (IIR) filter, a Surface Acoustic Wave (SAW) filter, a Bulk Acoustic Wave filter (BAW), a filter bank, etc. The DCO 27 may correspond to any Voltage Controlled Oscillator (VCO). A DCO may be a digital/analogue electronic oscillator, which may be controlled by a digital input value. The DCO 27 determines the output of the PLL 50 based on the digital output of the loop filter 26.

The PLL 50 further comprises a divider 24 configured to divide an output of the PLL 50 based on the time difference to obtain an irregularly divided clock signal. The divider 24 may correspond to any means for dividing the clock rate of the output signal by a certain divider value, which will be detailed subsequently. The dividers 24, 16 etc. described herein may correspond to frequency dividers, which could be fractional or integer, scalers, prescalers etc., and they may be implemented using digital or analog components, e.g. as a number of subsequent flip-flops, e.g. D-flip-flops.

The TDC 22 comprises a clock input coupled to the irregularly divided clock signal as output by the divider 24. The loop filter 26 also comprises a clock input. The clock input of the loop filter 26 is also coupled to the irregular clock signal as output by the clock generator 10. The delta signal of the clock generator 10, as introduced above, determines a divider ratio, where multiple implementation options are conceivable in examples.

For example, a functional module or unit 28 may be used as also indicated in FIG. 6. For example, the delta signal or value may be multiplied with a factor of 1/N and the result may be multiplied with a channel word, before being input into a Multi stAge noise SHaping module 30 (MASH), e.g. a sigma-delta-MASH 30. The functional module or unit 28 may then determine or calculate a channel word to be input into the MASH 30. The MASH 30 may then determine the divider value to be provided to the divider 24, based on the modified or multiplied channel word. The functional module or unit 28 and the MASH 30 may be implemented using digital or analog components, e.g. programmable hardware or logical components. The MASH 30 may be configured shape a spectral noise introduced by the divider 24 and it may be implemented using digital or logical components, such as accumulators adders, flip-flops, programmable hardware, etc.

In another example, the PLL 50 may comprise a look-up table instead of the functional unit or module 28 with a mapping between values of the time difference, indicated by the delta signal, and a channel word to be input in the MASH 30, e.g. implemented as a sigma-delta MASH. The MASH 30 may be coupled to the divider 24. The MASH 30 may be configured to provide an input value to the divider 24 based on the time difference. In such an example the look-up table 28 may provide a predefined or stored mapping between the values of the delta signal and a channel word. The look-up table 28 may hence comprise any memory or storage module, unit or device.

FIG. 6 illustrates the application of a clock generator 10 in a divider based PLL 50. When the PLL 50 is in locked state, the output edge of the feedback divider 24 may be close to the reference edge. Any deviation will be seen as phase error and the control loop may try to correct for it. Using an irregular clock in such a PLL 50, the phase shifts of the clock edges will also be seen as a phase error if the divider values are not considering the shifts. However, since the phase shifts are exactly known, the divider values can be corrected. The channel word, cw, is defined as the ratio between the wanted DCO frequency, $f_{DCO}$ and the reference frequency, fc or $f_{REF}$:

$$cw = \frac{f_{DCO}}{f_{REF}}.$$

But the irregular clock has a varying period (frequency). The instantaneous period is given by the time difference $T_{REF,irr}$ between two consecutive clock edges, which is available from the delta signal:

$$T_{REF,irr} = \frac{1}{f_{REF}N} \text{delta}.$$

This means that a correction of the channel word can be done by applying the factor delta/N to the channel word. The implementation of this correction in a digital PLL 50 is shown in FIG. 6. The loop filter 26 is also clocked with the irregular clock, but since the average clock rate is the same as a regular clock, the transfer function of the filter is maintained in the example. For an optimized implementation the multiplication of the channel word can be replaced by a look-up table of pre-calculated channel words for the different values of delta.

Figure 7:
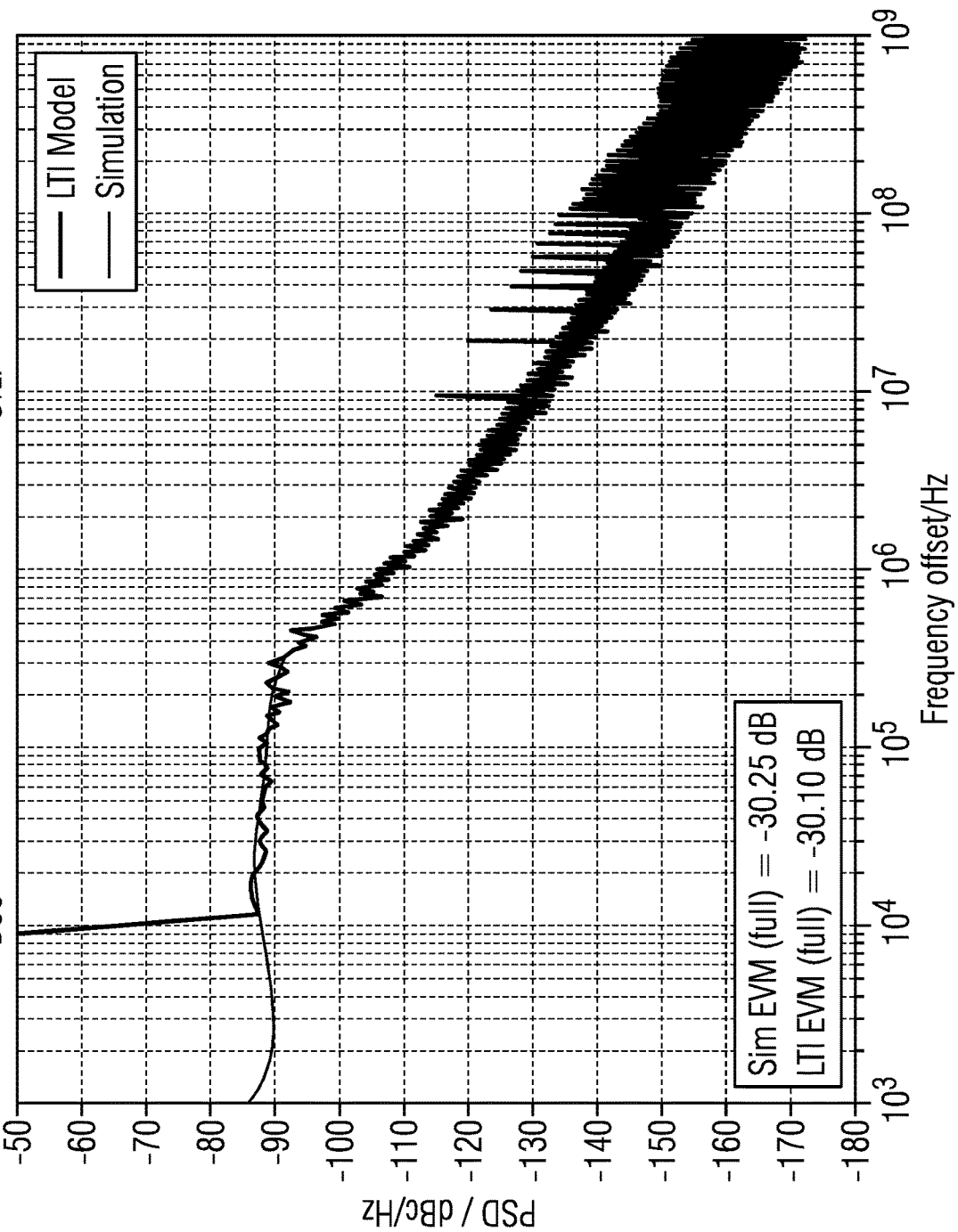
FIG. 7 shows a simulated example PLL spectrum with a regular clock.

In the following simulation results will be presented. For comparison, FIG. 7 shows a simulated PLL spectrum with a regular clock. For the simulations a time based Matlab model of a digital PLL was used. In the simulation, a small disturbance of the DCO frequency with every rising edge of the reference clock was introduced, in order to show the effectiveness of the increased harmonics spacing. The simulation was performed for regular clock (FIG. 7), irregular clock with N=2 (FIG. 8) and irregular clock with N=4 (FIG. 9), maintaining the effective clock rate of the PLL reference clock at $f_{REF}$=9.6 MHz. Further simulation parameters were $f_{LO}$=2950 MHz (local oscillator frequency), $T_{TDC}$=10 ps (TDC sampling interval), $f_{BW}$=175 kHz (bandwidth), $f_{DCO}$=5900 MHz (DCO clock rate), $f_{OS}$=737.5 MHz (internal DCO clock rate for updating DCO tuning signals), and $f_{STEP}$=100 kHz (simulation frequency step width).

Figure 8:
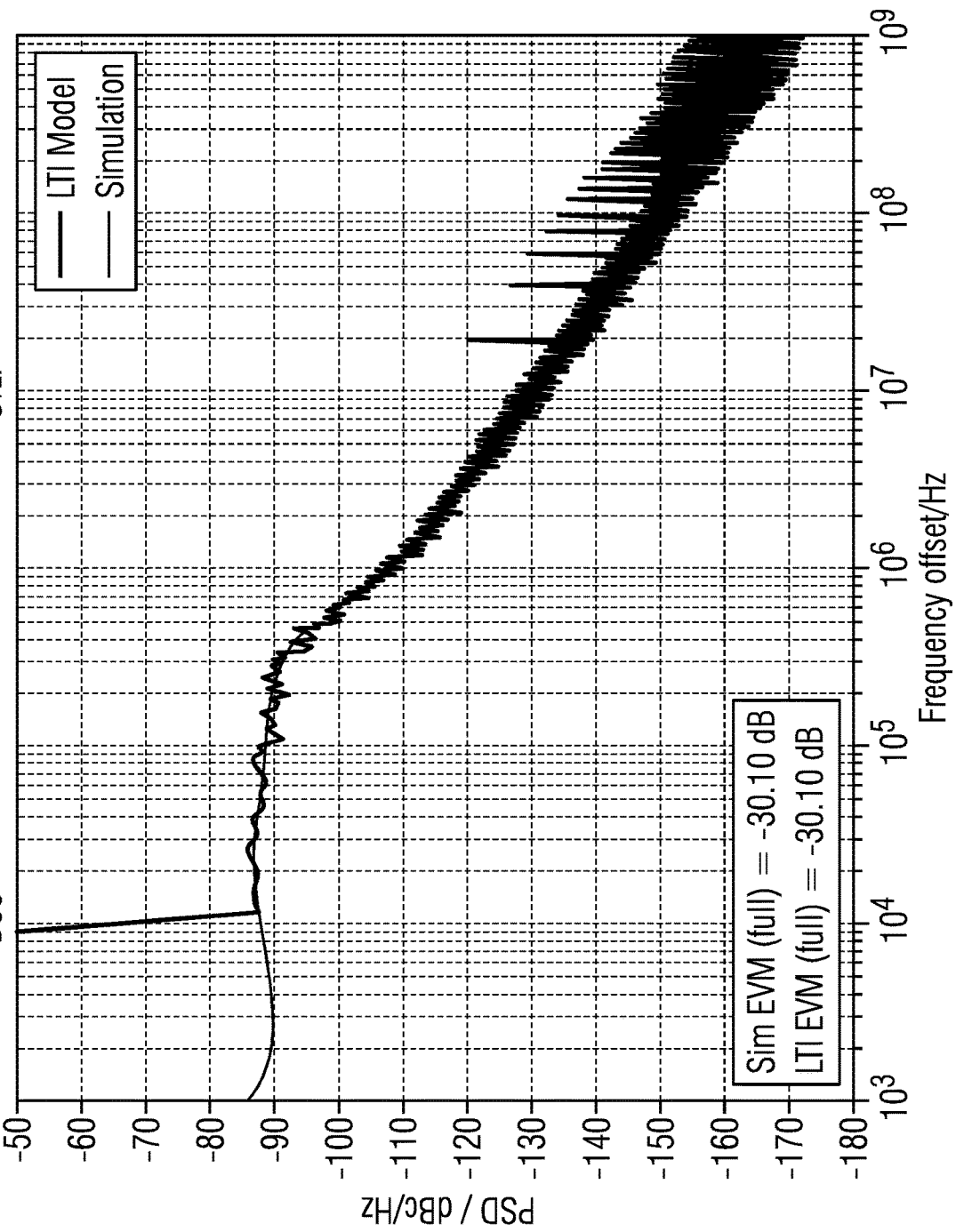
FIG. 8 shows a simulated example PLL spectrum with an irregular clock.
Figure 9:
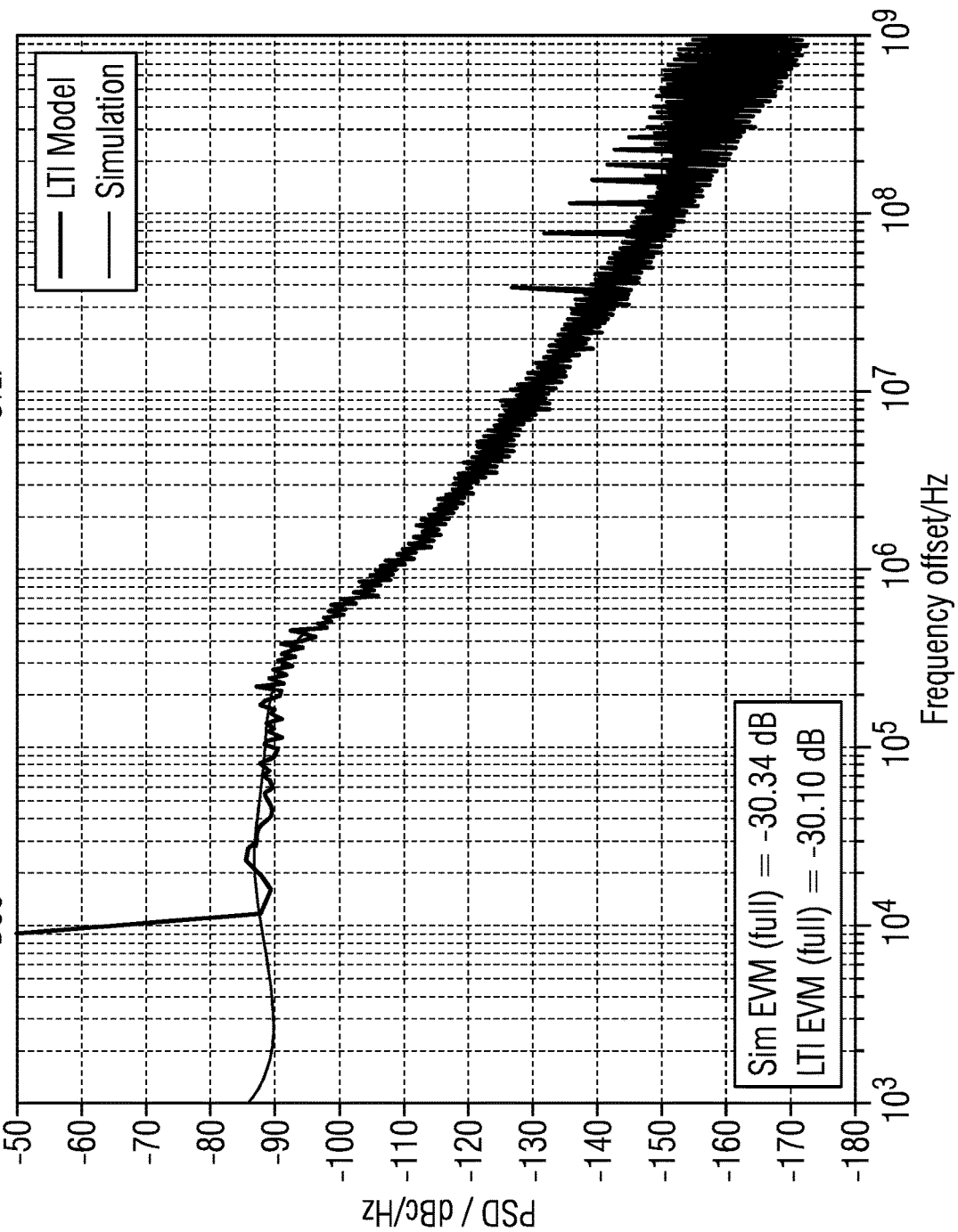
FIG. 9 shows another simulated example PLL spectrum with an irregular clock.

From the simulation results presented in FIGS. 7 to 9 it can be seen in that the spurs arising from the reference clock disturbing the DCO are spaced as expected with N times the reference clock frequency (9.6 MHz spacing in FIG. 7, 19.2 MHz spacing in FIG. 8, and 38.4 MHz spacing in FIG. 9). It can also be seen that the spectral shape as well as Error Vector Magnitude (EVM, (integrated noise)) is not influenced by the fact that the loop filter 26 is clocked with the irregular clock.

Figure 10:
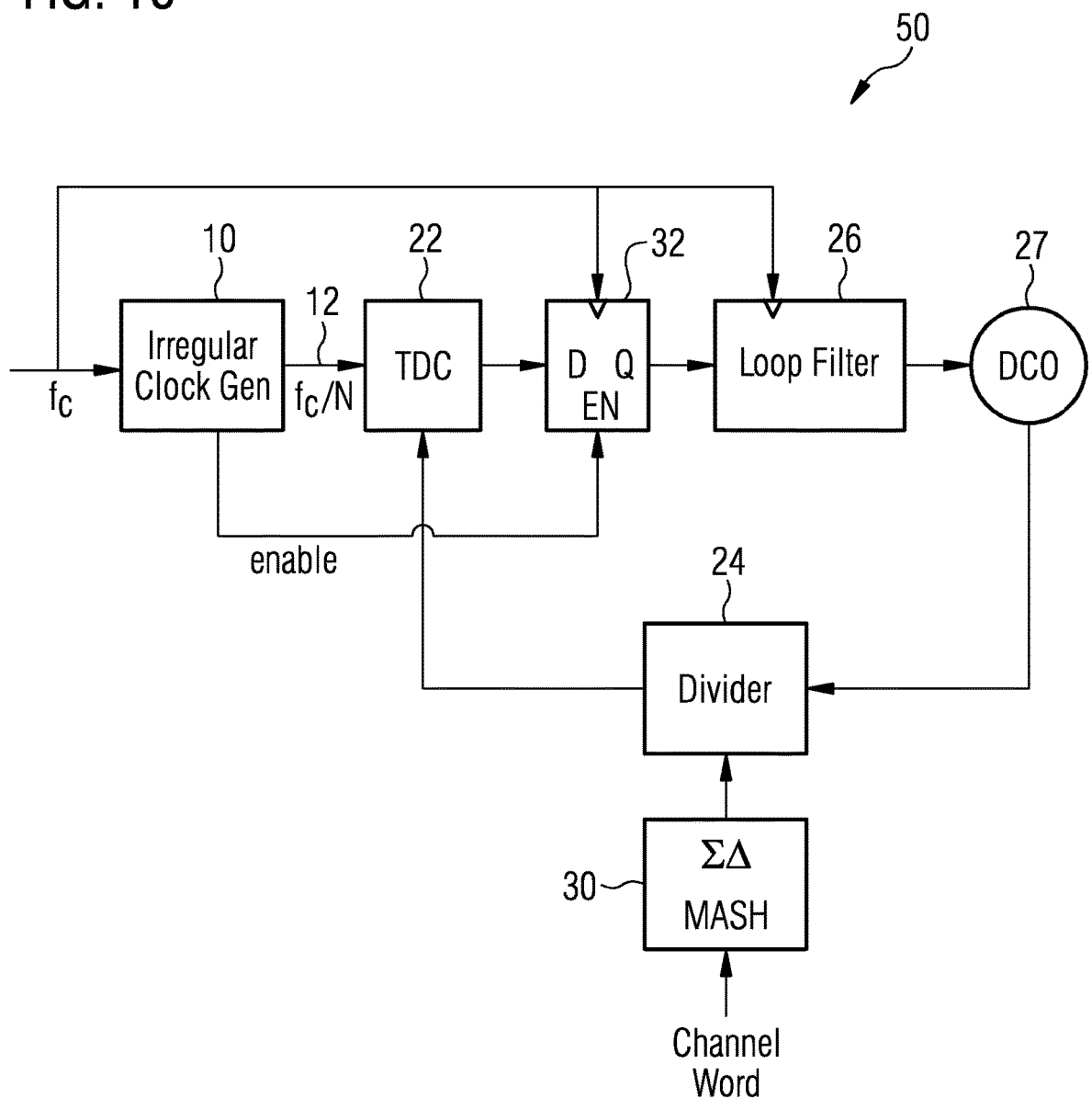
FIG. 10 depicts a block diagram of another example of a PLL.

FIG. 10 depicts a block diagram of another example of a PLL 50. In the example depicted in FIG. 10 the PLL 50 comprises a gating module 32 coupled to the output of the TDC 22. The gating module 32 comprises an input for a clock signal, which is coupled to the irregular clock signal, the output of the TDC 22, respectively. The gating module 32 comprises an input for a reference signal, and the gating module 32 is configured to output samples based on the reference signal. The gating module 32 may be any means, device or unit that may be configured to gate the input of the loop filter 26 from the output of the TDC 22. For example, the gating module 32 comprises a latch or a flip-flop. A clock input of the latch may be coupled to the reference signal and an enable input of the latch may be coupled to the irregular clock signal.

If irregular clocking of the loop filter 26 should be avoided, an alternative implementation in example is possible by running the loop filter 26 on the high rate clock but sample the input to the filter 26 only when a low rate clock edge is present, which is carried out by the gating module 32 in FIG. 10. This means for high rate cycles between two low rate edges the same input value is held. Furthermore, the PLL 50 channel word can be referred to the high rate clock. This means that the MASH modulator 30 providing the divider values to the divider 24 may also run at high clock rate. The TDC 22 may then simply ignore the additional edges at the divider signal input. This may avoid the need to update the channel word according to the low rate clock cycle because it is referred to the constant high rate clock.

As further indicated by the broken line box in FIG. 1, examples may also provide a radio frequency transceiver 100 comprising an example of a phase locked loop 50 according to the present description. A radio transceiver 100 may comprise typical transmitter, receiver, and/or transceiver components. Examples of such components are one or more elements of the group of one or more Low-Noise Amplifiers (LNAs), one or more Power Amplifiers (PAs), one or more filters or filter circuitry, one or more diplexers, one or more duplexers, one or more Analog-to-Digital converters (A/D), one or more Digital-to-Analog converters (D/A), one or more modulators or demodulators, one or more mixers, one or more antennas, etc.

Figure 11:
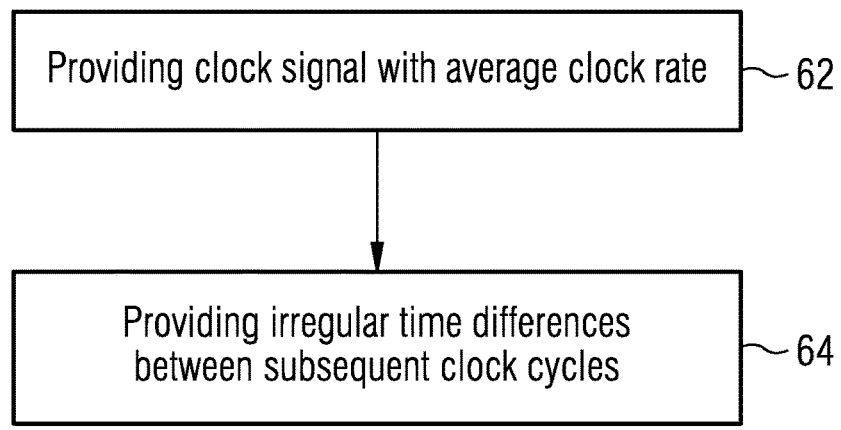
FIG. 11 illustrates a block diagram of an example of a method for generating an irregular clock signal.

FIG. 11 illustrates a block diagram of an example of a method for generating an irregular clock signal. The method for providing a clock signal comprises providing/generating 62 the clock signal with a predefined average clock rate by a clock generator 10. The method further comprises providing 64 a reference signal and dividing the reference signal to generate the clock signal, wherein a time difference between a clock cycle and a subsequent clock cycle of the clock signal is irregular.

Another example is a computer program having a program code for performing at least one of the methods described herein, when the computer program is executed on a computer, a processor, or a programmable hardware component. Another example is a machine readable storage including machine readable instructions, when executed, to implement a method or realize an apparatus as described herein. A further example is a machine readable medium including code, when executed, to cause a machine to perform any of the methods described herein.

The examples as described herein may be summarized as follows:

Example 1 is a system comprising a clock generator 10 configured to provide a clock signal having a predefined average clock rate, a reference signal generator 14 configured to provide a reference signal, and a clock divider 16 configured to divide the reference signal to generate the clock signal, wherein a time difference between a clock cycle and a subsequent clock cycle of the clock signal is irregular.

Example 2 is the system of example 1, wherein a clock frequency of the reference signal is an integer multiple of the predefined average clock rate.

Example 3 is the system of one of the examples 1 or 2, wherein the clock divider 16 is configured to divide the reference signal based on a varying divider ratio.

Example 4 is the system of example 3, wherein an average varying divider ratio defines a ratio between the reference signal and the predefined average clock rate.

Example 5 is the system of one of the examples 1 to 4, comprising a random number generator 18 configured to generate random numbers at a predefined distribution.

Example 6 is the system of example 5, wherein the predefined distribution is a uniform distribution and wherein the random number generator 18 is configured to generate uniformly distributed random integer numbers between 0 and an N−1.

Example 7 is the system of example 6, comprising a differentiator 20 configured to determine a difference between at least two subsequently generated random numbers.

Example 8 is the system of example 7, comprising a multi-modulus-divider 16 configured to set a time difference between at least two clock cycles in the clock signal based on a number of cycles in the reference signal, wherein the number of cycles in the reference signal between the at least two clock cycles in the clock signal corresponds to the difference between the at least two subsequently generated random numbers.

Example 9 is a phase locked loop 50 comprising the system of one of the preceding examples.

Example 10 is the phase locked loop 50 of example 9, comprising a time-to-digital converter 22 with an input, wherein the output 12 of the clock generator 10 is coupled to the input of the time-to-digital converter 22.

Example 11 is the phase locked loop 50 of one of the examples 9 or 10, comprising a divider 24 configured to divide an output of the phase locked loop 50 based on the time difference to obtain an irregularly divided clock signal.

Example 12 is the phase locked loop 50 of example 11, wherein the time-to-digital converter 22 has a clock input which is coupled to the irregularly divided clock signal.

Example 13 is the phase locked loop 50 of one of the examples 11 or 12, comprising a loop filter 26 with a clock input, wherein the clock input of the loop filter 26 is coupled to the irregularly divided clock signal.

Example 14 is the phase locked loop 50 of one of the examples 9 to 13, comprising a look-up table with a mapping between values of the time difference and a channel word to be input in a multi stage noise shaping module 30.

Example 15 is the phase locked loop 50 of example 14, wherein the multi stage noise shaping module 30 is coupled to the divider 24 and wherein the multi stage noise shaping module 30 is configured to provide an input value to the divider 24 based on the time difference.

Example 16 is the phase locked loop 50 of one of the examples 9 or 10, comprising a gating module 32 coupled to the output of the time-to-digital converter 22, wherein the gating module 32 comprises an input for the clock signal, which is coupled to the irregular clock signal, and wherein the gating module 32 comprises an input for a reference signal, and wherein the gating module 32 is configured to output samples based on the reference signal.

Example 17 is the phase locked loop 50 of example 16, wherein the gating module 32 comprises a latch, wherein a clock input of the latch is coupled to the reference signal and wherein an enable input of the latch is coupled to the irregular clock signal.

Example 18 is a radio frequency transceiver 100 comprising a phase locked loop 50 according to one of the examples 9 to 17.

Example 19 is a system comprising an apparatus 10 for providing a clock signal having a predefined average clock rate, means 14 for providing a reference signal, and means 16 for dividing the reference signal to generate the clock signal, wherein a time difference between a clock cycle and a subsequent clock cycle of the clock signal is irregular.

Example 20 is the system of example 19, wherein a clock frequency of the reference signal is an integer multiple of the predefined average clock rate.

Example 21 is the system of one of the examples 19 or 20, wherein the means 16 for dividing is configured for dividing the reference signal based on a varying divider ratio.

Example 22 is the system of example 21, wherein an average varying divider ratio defines a ratio between the reference signal and the predefined average clock rate.

Example 23 is the system of one of the examples 19 to 22, comprising means 18 for generating random numbers at a predefined distribution.

Example 24 is the system of example 23, wherein the predefined distribution is a uniform distribution and wherein the means 18 is configured for generating uniformly distributed random integer numbers between 0 and an N−1.

Example 25 is the system of example 24, comprising means 20 for determining a difference between at least two subsequently generated random numbers.

Example 26 is the system of example 25, comprising means 16 for setting a time difference between at least two clock cycles in the clock signal based on a number of cycles in the reference signal, wherein the number of cycles in the reference signal between the at least two clock cycles in the clock signal corresponds to the difference between the at least two subsequently generated random numbers.

Example 27 is a phase locked loop 50 apparatus comprising the system of one of the examples 19 to 26.

Example 28 is the apparatus 50 of example 27, comprising means 22 for time-to-digital converting with an input, wherein the output 12 of the apparatus 10 is coupled to the input of the means 22 for time-to-digital converting.

Example 29 is the apparatus 50 of one of the examples 27 or 28, comprising dividing means 24 for dividing an output of the apparatus 50 based on the time difference to obtain an irregularly divided clock signal.

Example 30 is the apparatus 50 of example 29, wherein the means 22 for time-to-digital converting comprises a clock input coupled to the irregularly divided clock signal.

Example 31 is the apparatus 50 of one of the examples 29 or 30, comprising means 26 for loop filtering with a clock input, wherein the clock input of the means 26 for loop filtering is coupled to the irregularly divided clock signal.

Example 32 is the apparatus 50 of one of the examples 27 to 31, comprising means for looking-up a table with a mapping between values of the time difference and a channel word to be input in means 30 for multi stage noise shaping.

Example 33 is the apparatus 50 of example 32, wherein the means 30 for multi stage noise shaping is coupled to the means 24 for dividing and wherein the means 30 for multi stage noise shaping is configured for providing an input value to the means 24 for dividing based on the time difference.

Example 34 is the apparatus 50 of one of the examples 27 or 28, comprising means 32 for gating coupled to the output of the means 22 for time-to-digital converting, wherein the means 32 for gating comprises an input for the clock signal, which is coupled to the irregular clock signal, and wherein the means 32 for gating comprises an input for a reference signal, and wherein the means for gating is configured to output samples based on the reference signal.

Example 35 is the apparatus 50 of example 34, wherein the means 32 for gating comprises a latch, wherein a clock input of the latch is coupled to the reference signal and wherein an enable input of the latch is coupled to the irregular clock signal.

Example 36 is a radio frequency transceiver apparatus 100 comprising an apparatus 50 according to one of the examples 27 to 35.

Example 37 is a method for providing a clock signal, the method comprising generating a clock signal with a predefined average clock rate by a clock generator, providing a reference signal, and dividing the reference signal to generate the clock signal, wherein a time difference between a clock cycle and a subsequent clock cycle of the clock signal is irregular.

Example 38 is the method of example 37, wherein a clock frequency of the reference signal is an integer multiple of the predefined average clock rate.

Example 39 is the method of one of the examples 37 or 38, comprising dividing the reference signal based on a varying divider ratio.

Example 40 is the method of example 39, wherein an average varying divider ratio defines a ration between the reference signal and the predefined average clock rate.

Example 41 is the method of one of the examples 37 to 40, comprising generating random numbers at a predefined distribution.

Example 42 is the method of example 41, wherein the predefined distribution is a uniform distribution and comprising generating uniformly distributed random integer numbers between 0 and an N−1.

Example 43 is the method of example 42, comprising determining a difference between at least two subsequently generated random numbers.

Example 44 is the method of example 43, comprising setting a time difference between at least two clock cycles in the clock signal based on a number of cycles in the reference signal, wherein the number of cycles in the reference signal between the at least two clock cycles in the clock signal corresponds to the difference between the at least two subsequently generated random numbers.

Example 45 is a method for a phase locked loop 50 comprising the method of one of the examples 37 to 44.

Example 46 is the method of example 45, comprising time-to-digital converting the clock signal.

Example 47 is the method of one of the examples 45 or 46, comprising dividing an output of the phase locked loop method based on the time difference to obtain an irregularly divided clock signal.

Example 48 is the method of example 47, clocking the time-to-digital converting based on the irregularly divided clock signal.

Example 49 is the method of one of the examples 47 or 48, comprising loop filtering based on the irregularly divided clock signal.

Example 50 is the method of one of the examples 37 to 49, comprising looking-up a table with a mapping between values of the time difference and a channel word to be used for multi stage noise shaping.

Example 51 is the method of example 50, wherein the multi stage noise shaping comprises providing an input value for the dividing based on the time difference.

Example 52 is the method of one of the examples 45 or 46, comprising gating based on the irregular clock signal.

Example 53 is the method of example 52, wherein the gating comprises enabling a latch based on the irregular clock signal.

Example 54 is a mobile device or terminal comprising a radio transceiver 100 of one of the examples 18 or 36.

Example 55 is a computer program having a program code for performing the method of at least one of the examples 37 to 53, when the computer program is executed on a computer, a processor, or a programmable hardware component.

Example 56 is a machine readable storage including machine readable instructions, when executed, to implement a method or realize an apparatus as exemplified in any example described herein.

Example 57 is a machine readable medium including code, when executed, to cause a machine to perform the method of any one of examples 37 to 53.

The aspects and features mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computerexecutable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field programmable logic arrays ((FPLAs or (field programmable gate arrays ((FPGAs, programmed to perform the acts of the above-described methods.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s to furthering the art. All statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a sensor signal", "means for generating a transmit signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software, but may include digital signal processor (DSP hardware, network processor, application specific integrated circuit (ASIC, field programmable gate array (FPGA, read only memory (ROM for storing software, random access memory (RAM, and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A system comprising:
   a clock generator configured to provide a clock signal having a predefined average clock rate,
   a reference signal generator configured to provide a reference signal,
   a clock divider configured to divide the reference signal to generate the clock signal,
      wherein a time difference between a clock cycle and a subsequent clock cycle of the clock signal is irregular,
   a random number generator configured to generate random numbers at a predefined distribution, and
   a differentiator configured to determine a difference between at least two subsequently generated random numbers.

2. System of claim 1, wherein a clock frequency of the reference signal is an integer multiple of the predefined average clock rate.

3. System of claim 1, wherein the clock divider is configured to divide the reference signal based on a varying divider ratio.

4. System of claim 3, wherein an average varying divider ratio defines a ratio between the reference signal and the predefined average clock rate.

5. System of claim 1, wherein the predefined distribution is a uniform distribution and wherein the random number generator is configured to generate uniformly distributed random integer numbers between 0 and an N−1.

6. System of claim 1, comprising a multi-modulus-divider configured to set a time difference between at least two clock cycles in the clock signal based on a number of cycles in the reference signal, wherein the number of cycles in the reference signal between the at least two clock cycles in the clock signal corresponds to the difference between the at least two subsequently generated random numbers.

7. A phase locked loop comprising the system of claim 1.

8. The phase locked loop of claim 7, comprising a time-to-digital converter with an input, wherein the output of the clock generator is coupled to the input of the time-to-digital converter.

9. The phase locked loop of claim 7, comprising a divider configured to divide an output of the phase locked loop based on the time difference to obtain an irregularly divided clock signal.

10. The phase locked loop of claim 9, wherein the time-to-digital converter comprises a clock input coupled to the irregularly divided clock signal.

11. The phase locked loop of claim 9, comprising a loop filter with a clock input, wherein the clock input of the loop filter is coupled to the irregularly divided clock signal.

12. The phase locked loop of claim 7, comprising a look-up table with a mapping between values of the time difference and a channel word to be input in a multi stage noise shaping module.

13. The phase locked loop of claim 12, wherein the multi stage noise shaping module is coupled to the divider and wherein the multi stage noise shaping module is configured to provide an input value to the divider based on the time difference.

14. The phase locked loop of claim 7, comprising a gating module coupled to the output of the time-to-digital converter, wherein the gating module comprises an input for the clock signal, which is coupled to the irregular clock signal, and wherein the gating module comprises an input for a reference signal, and wherein the gating module is configured to output samples based on the reference signal.

15. The phase locked loop of claim 14, wherein the gating module comprises a latch, wherein a clock input of the latch is coupled to the reference signal and wherein an enable input of the latch is coupled to the irregular clock signal.

16. A method for providing a clock signal, the method comprising:
   generating a clock signal with a predefined average clock rate by a clock generator,
   providing a reference signal,
   dividing the reference signal to generate the clock signal, wherein a time difference between a clock cycle and a subsequent clock cycle of the clock signal is irregular, generating random numbers at a predefined distribution, and determining a difference between at least two subsequently generated random numbers.

17. The method of claim 16, wherein a clock frequency of the reference signal is an integer multiple of the predefined average clock rate.

18. The method of claim 16, comprising dividing the reference signal based on a varying divider ratio.

19. The method of claim 16, wherein an average varying divider ratio defines a ratio between the reference signal and the predefined average clock rate.

20. A non-transitory machine readable medium including code, when executed, to cause a machine to perform a method for providing a clock signal, the method comprising:

generating a clock signal with a predefined average clock rate by a clock generator, providing a reference signal, dividing the reference signal to generate the clock signal, wherein a time difference between a clock cycle and a subsequent clock cycle of the clock signal is irregular, generating random numbers at a predefined distribution, and determining a difference between at least two subsequently generated random numbers.

* * * * *